(12) United States Patent
Hynecek et al.

(10) Patent No.: US 8,928,792 B1
(45) Date of Patent: Jan. 6, 2015

(54) CMOS IMAGE SENSOR WITH GLOBAL SHUTTER, ROLLING SHUTTER, AND A VARIABLE CONVERSION GAIN, HAVING PIXELS EMPLOYING SEVERAL BCMD TRANSISTORS COUPLED TO A SINGLE PHOTODIODE AND DUAL GATE BCMD TRANSISTORS FOR CHARGE STORAGE AND SENSING

(75) Inventors: Jaroslav Hynecek, Allen, TX (US); Gennadiy Agranov, San Jose, CA (US); Xiangli Li, San Jose, CA (US); Hirofumi Komori, San Jose, CA (US); Xia Zhao, Campbell, CA (US); Chung Chun Wan, Fremont, CA (US)

(73) Assignee: Aptina Imaging Corporation, George Town (KY)

( * ) Notice: Subject to any disclaimer, the term of this patent is extended or adjusted under 35 U.S.C. 154(b) by 705 days.

(21) Appl. No.: 13/153,369

(22) Filed: Jun. 3, 2011

Related U.S. Application Data

(60) Provisional application No. 61/438,036, filed on Jan. 31, 2011.

(51) Int. Cl.
| | | |
|---|---|---|
| H04N 5/335 | (2011.01) | |
| H04N 5/359 | (2011.01) | |
| H04N 5/3745 | (2011.01) | |

(52) U.S. Cl.
CPC ........... *H04N 5/3591* (2013.01); *H04N 5/3745* (2013.01)
USPC ...................................................... 348/308

(58) Field of Classification Search
CPC ... H04N 5/357; H04N 5/3745; H04N 5/3591; H04N 9/045; H01L 27/14603; H01L 27/14607; H01L 27/14609; H01L 27/14612

USPC .................................................. 348/300–308
See application file for complete search history.

(56) References Cited

U.S. PATENT DOCUMENTS

| | | | | | |
|---|---|---|---|---|---|
| 4,901,129 | A | * | 2/1990 | Hynecek | 257/223 |
| 5,424,223 | A | * | 6/1995 | Hynecek | 438/59 |
| 5,471,245 | A | * | 11/1995 | Cooper et al. | 348/302 |
| 5,625,210 | A | * | 4/1997 | Lee et al. | 257/292 |
| 6,657,665 | B1 | | 12/2003 | Guidash et al. | |

(Continued)

*Primary Examiner* — Aung S Moe
*Assistant Examiner* — Amy Hsu

(57) ABSTRACT

The invention describes a solid-state CMOS image sensor array and discloses image sensor array pixels with global and rolling shutter capabilities that utilize multiple BCMD transistors for a single photodiode, for charge storage and sensing. Thus, the valuable pixel area saved by employing the BCMD transistor for charge storage and sensing is used by placing several BCMD transistors coupled to one photodiode. This increases the Dynamic Range (DR) of the sensor, since the same photodiode can integrate charge for different integration times, both long and short. This allows sensing of two different image signals from a single pixel without saturation, a low level signal with long integration time followed by a high level signal with short integration time. The signal processing circuits located at the periphery of the array can then process these signals into a single Wide Dynamic Range (WDR) output. Further disclosed is an image sensor array with pixels that use BCMD transistors for charge storage and sensing having multiple concentric gates, which allows changing the conversion gain of the BCMD transistors by applying various biases to the gates. Variable conversion gain is a useful feature when building WDR sensors since low conversion gain and high well capacity allows detection of high level signals and the same structure can be used to detect, at the same time, low level signals with high conversion gain and thus low noise.

9 Claims, 7 Drawing Sheets

(56) References Cited

U.S. PATENT DOCUMENTS

2005/0237404 A1* 10/2005 Jerdev et al. .................. 348/303
2006/0255371 A1* 11/2006 Roy et al. ...................... 257/223
2008/0290382 A1* 11/2008 Hirota ........................... 257/291
2010/0177226 A1*  7/2010 Itonaga et al. ................ 348/300
2013/0044247 A1*  2/2013 Kawahito et al. ............. 348/296

* cited by examiner

CMOS IMAGE SENSOR WITH GLOBAL SHUTTER, ROLLING SHUTTER, AND A VARIABLE CONVERSION GAIN, HAVING PIXELS EMPLOYING SEVERAL BCMD TRANSISTORS COUPLED TO A SINGLE PHOTODIODE AND DUAL GATE BCMD TRANSISTORS FOR CHARGE STORAGE AND SENSING

CROSS REFERENCE TO RELATED APPLICATION

This application claims priority under 35 USC Sec. 119(e)(1) of provisional application No. 61/438,036 filed on Jan. 31, 2011.

BACKGROUND OF THE INVENTION

1. Field of the Invention

The disclosed invention relates to solid-state image sensors and more particularly to small pixel size CMOS image sensors with both global and rolling shutter capability that incorporate BCMD transistors in the pixels with lateral or vertical reset for charge storage and sensing.

2. Description of Related Art

Typical image sensors sense light by converting impinging photons into electrons that are integrated (collected) in sensor pixels. After completion of an integration cycle collected charge is converted into a voltage, which is supplied to the output terminals of the sensor. In CMOS image sensors the charge to voltage conversion is accomplished directly in the pixels themselves and the analog pixel voltage is transferred to the output terminals through various pixel addressing and scanning schemes. The analog pixel voltage signal can also be converted on-chip to a digital equivalent before reaching the chip output. The pixels have incorporated in them a buffer amplifier, typically a source follower (SF), which drives the sense lines that are connected to the pixels by suitable addressing transistors. After charge to voltage conversion is completed and the resulting signal transferred out from the pixels, the pixels are reset in order to be ready for accumulation of new charge. In pixels that are using Floating Diffusion (FD) as the charge detection node, the reset is accomplished by momentarily turning on a reset transistor that conductively connects the FD node to a voltage reference, which is typically the pixel drain node. This step removes collected charge. However, it generates kTC—reset noise as is well known in the art. kTC noise has to be removed from the signal by the Correlated Double Sampling (CDS) signal processing technique in order to achieve the desired low noise performance. The typical CMOS sensors that utilize the CDS concept usually require four transistors (4T) in each pixel. An example of the 4T pixel circuit with pinned photodiode can be found in U.S. Pat. No. 5,625,210 to Lee, incorporated herein by reference.

In modern CMOS sensor designs the circuitry for several photodiodes may be shared as can found for example in U.S. Pat. No. 6,657,665 B1 to Guidash, which patent is herein incorporated by reference. In this patent the pixel consists of two photodiodes located in neighboring rows that share the same circuitry. Such shared circuit concept can result in having only two metal bus lines in the row direction and two metal bus lines in the column direction per photodiode. The circuit sharing is very useful for designing small pixels or pixels with high Fill Factor (FF) since the spacing and the width of the metal lines essentially determines the minimum pixel size.

The principal disadvantage of the standard CMOS sensors is that pixel scanning after charge has been accumulated in them is performed in a sequential manner row by row. This generates exposure time skew, which can be observed in the pictures of moving objects and which causes an undesirable picture distortion. This method of CMOS sensor scanning is called the "rolling shutter" mode and it resembles the action of the focal plane slit shutter in the old photographic film cameras. In most applications, however it is preferable to expose all the pixels of the image at the same time without the skew and thus eliminate the distortion of moving objects. This type of sensor operation is called the "global shuttering", which resembles the operation of a mechanical iris shutter in the film cameras. In order to implement this kind of global shuttering it is necessary to provide another charge storage site in the pixels. After charge is integrated in the photodiodes of the pixels it is transferred to the pixel storage sites simultaneously in all the pixels of the array where it can wait for the scanning in the row by row fashion. The pixel scanning time skew is thus independent of the frame pixel exposure time. There have been several methods published in the literature regarding how to incorporate an additional charge storage site into the CMOS sensor pixels. One recent publication is described in ISSCC Digest of Technical Papers pp. 398, 399, by Keita Yasutomi, Shinya Itoh, Shoji Kawahito entitled: "A 2.7e Temporal Noise 99.7% Shutter Efficiency 92 dB Dynamic Range CMOS Image Sensor with Dual Global Shutter Pixels", is a modification of the well known Interline Transfer CCD concept where charge from the pixel photodiodes is transferred first into vertical CCD registers located in the spaces between the pixels and then from there transferred in parallel fashion row by row into the serial register followed by the CCD transfer out into the common single amplifier. The application of the CCD charge transfer concept into a CMOS sensor to implement the global shutter mode is shown in FIG. 1.

The drawing 100 of FIG. 1 represents a simplified circuit diagram of a pixel of a CMOS sensor that has the global shuttering capability. After charge integration is completed in the pinned photodiode 101 it is transferred via the transfer gate transistor 103 into a second pinned photodiode 102 where it waits for scanning. The charge transfer from the first to the second pinned photodiode is completed in a CCD fashion without generating kTC noise. It is also necessary that the second pinned photodiode 102 has a higher pinning voltage than the first pinned photodiode 101 or the transfer gate 103 has a potential barrier and a well incorporated therein. It is also necessary that the second charge storage pinned photodiode 102 be well shielded from impinging photons 115 to prevent undesirable smear effects when the objects in the scene move. The signal charge readout from the second pinned photodiode 102 then proceeds in the standard way by first resetting the Floating Diffusion (FD) node 104 to the drain bias voltage by momentarily turning on the reset transistor 106 followed by pulsing the charge transfer transistor gate 105. This sequence can now proceed in a sequential order row by row. The signal appearing at the FD node 104 is buffered by the source follower transistor 107 that is addressed by a row addressing transistor 108. The signals to the charge transfer transistor gates 103 and 105, reset transistor 106, and the addressing transistor 108 are supplied by the row bus lines 111, 112, 113, and 114 respectively. The Vdd bias is supplied to the pixels by the column Vdd line 109 and the signal output appears on the column output line 110. Using the pinned photodiodes for charge storage is advantageous since it is well known that these diodes have a low dark current generation. High dark current in the storage sites would also add to noise and also would generate undesirable shading effects in the picture that would have to be compensated for. Unfortunately, the second pinned photodiode consumes a significant valuable pixel area, thus increasing the size of the sensor and ultimately its cost. It is thus desirable to investigate other possibilities of how to build CMOS sensors with the global shuttering capability that consume less pixel area and do not sacrifice the pixel performance. One possibility described in this disclosure is using the BCMD transistor as a charge storage and signal buffer amplifier.

An advantage of the BCMD concept is that only one transistor is used for the pixel addressing, charge sensing including the signal buffering, and charge reset. A description of the BCMD concept can be found in U.S. Pat. No. 5,424,223 and U.S. Pat. No. 4,901,129, both to Hynecek, and both patents are herein incorporated by reference. In the BCMD concept pixel charge is stored under the MOS transistor channel and modulates the transistor threshold. A change in the threshold voltage is sensed when a current is directed to flow through this transistor. After charge sensing has been completed the pixel needs to be reset by removing collected charge. In the original single transistor BCMD concept charge was removed from the pixel in a vertical direction. The BCMD pixel using additional reset structure to provide charge reset in a lateral (horizontal) direction has been developed previously, which has an advantage in Back Side Illuminated (BSI) applications. The BCMD lateral reset removes charge from the pixel completely without kTC noise generation, which is another advantage of this concept. The lateral reset is described in more detail in U.S. Pat. No. 5,424,223 to Hynecek. Another alternate of the BCMD lateral pixel reset is shown in FIG. 2.

In the drawing 200 of FIG. 2 is a simplified cross section of a pixel that consists of a pinned photodiode (PD) and a BCMD charge sensing transistor. A p+ substrate 201 has an epitaxial (epi) p− doped layer 202 deposited thereon. An active region of the pixel is defined by an STI trench 209 that is completely filled by oxide. Another oxide layer 208 covers the entire surface of the pixel array except for contact openings. A p+ layer 204 covers the surface of the PD and extends along the sides of the STI trenches to the bottom of the STI. Another p+ layer 210 is positioned below the BCMD transistor to prevent the photo generated electrons 207 from flowing into the transistor. The photo generated charge 206 accumulates in the n type doped region 205. After completion of integration the charge is transferred from the PD under the BCMD gates 212 that encircles the p+ type doped BCMD source 216. The charge transfer is accomplished by momentarily pulsing the transfer gate 211 positive. The transferred charge under the BCMD gate 212 accumulates in regions 215 where it causes change in the BCMD transistor threshold. This change is the signal that is sensed and processed by the sensor circuits. The reset of the BCMD transistor is accomplished by completely removing charge from the regions 215 and thus restoring the original BCMD transistor threshold without generating any kTC noise. The charge removal is initiated by momentarily pulsing the reset gate 213 positive. The charge transfer pulses to the BCMD transistor and its reset can have independent timing from the pixel integration and addressing thus allowing multiple sensing of the BCMD transistor potential at various times thereby reducing the readout noise. Charge from the BCMD transistor flows into the n+ type doped drain 214 that is biased at Vdd potential. The pulses are supplied to the transfer gate 211, BCMD gate 212 and the reset transistor gate 213 via the row bus lines 219, 220, and 218 respectively. The signal appears at the source of the BCMD transistor 216 and is bussed by the column sense lines 217 to the signal processing circuits located at the periphery of the array. The Vdd potential is supplied to the pixel drain 214 via the column bus line 221.

An advantage of using the BCMD structure in the CMOS sensors that have the global shutter capability in comparison to the non-BCMD prior art is that the charge storage and sensing is accomplished in the same structure, which saves valuable pixel area. Another advantage is that the charge sensing is nondestructive, so no kTC noise is generated. It is thus possible to reverse the order of the double sampling for transistor threshold subtraction without the necessity of correlation to charge transfer from the photodiode. The empty BCMD potential can be sensed after charge has been removed from it, since this potential is identical with the potential before charge has been transferred into the BCMD.

SUMMARY OF THE INVENTION

It is an object of the disclosed invention to overcome limitations in the prior art. It is a further object of the disclosed invention to provide a practical CMOS sensor design using the BCMD sensing transistor with a lateral or vertical charge reset capability that can be used in high performance CMOS image sensor arrays, and which can operate in both the rolling shutter and the global shutter modes. Furthermore it is an object of the disclosed invention to provide a CMOS image sensor design with pixels that have several BCMD charge storage sites per pixel and thus can accumulate signal charge from one pixel for several integration times. Finally, it is an object of the present invention to provide a CMOS image sensor pixel design that has BCMD charge detection transistors with variable conversion gain, achieved by designing several concentric BCMD transistor gates, which can be biased at various biasing conditions during charge sensing.

BRIEF DESCRIPTION OF THE DRAWINGS

The invention will be described in detail in the following description of the preferred embodiments with reference to the following figures wherein.

DESCRIPTION OF PREFERRED EMBODIMENTS

Figure 1:
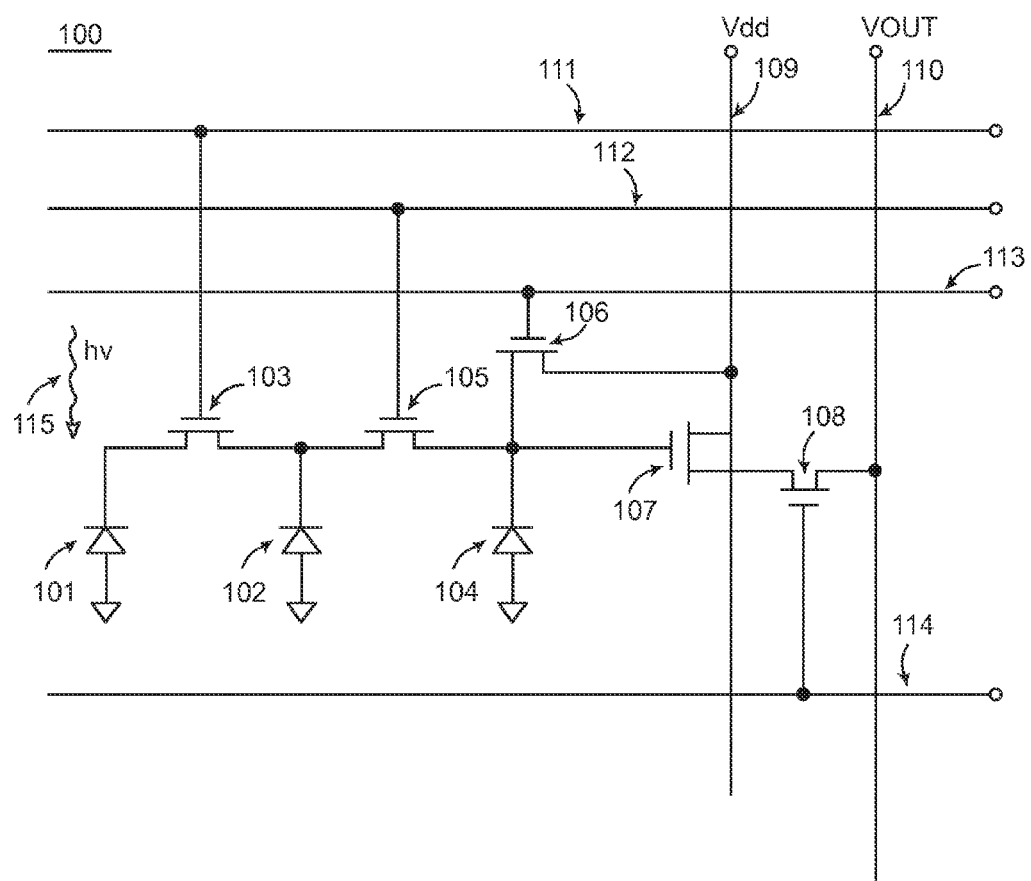
FIG. 1 shows a simplified schematic diagram of a prior art CMOS sensor pixel that has the global shutter capability by using a second pinned diode for charge storage.
Figure 2:
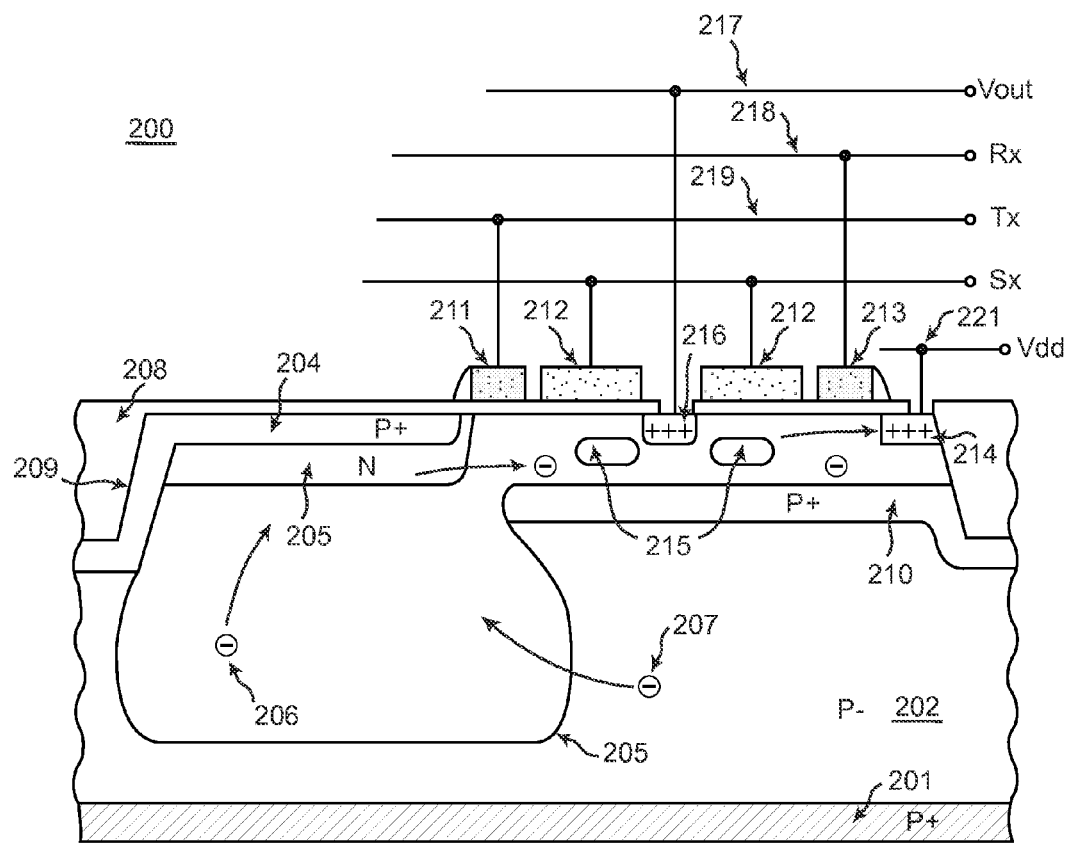
FIG. 2 shows a simplified cross section of a prior art BCMD pixel with the transfer gate for charge transfer from the photodiode and the lateral reset gate and drain structures for reset.
Figure 3:
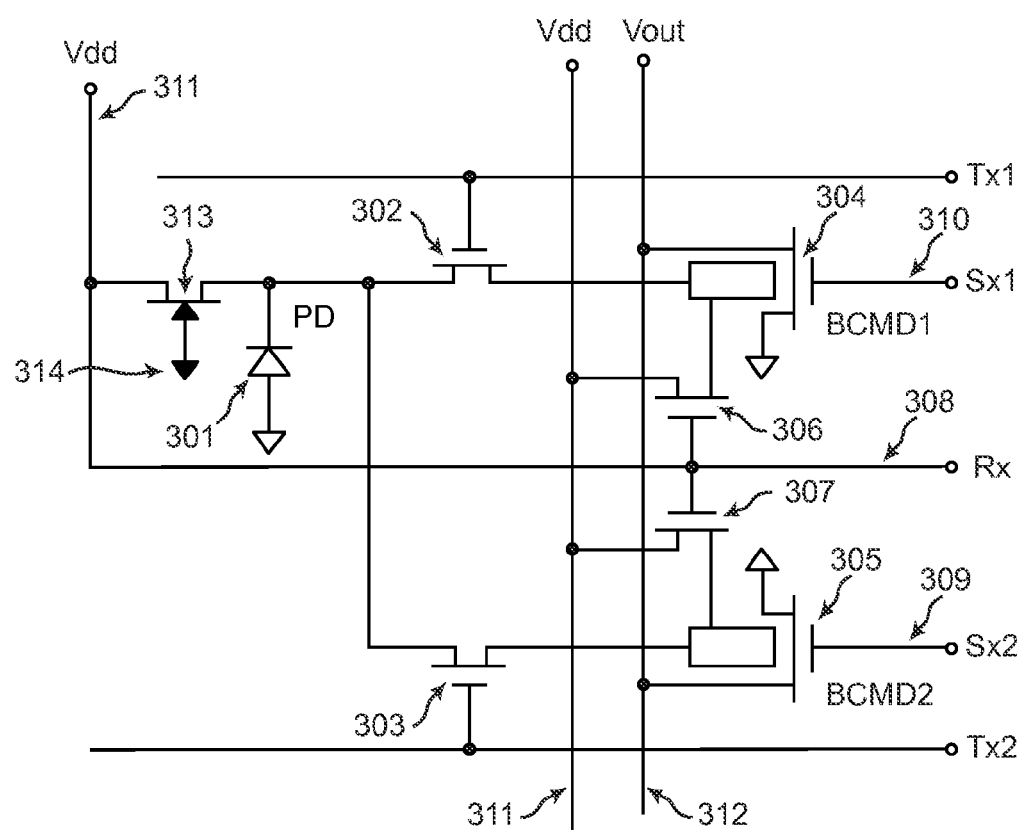
FIG. 3 shows a simplified schematic diagram of a CMOS sensor pixel that has a single pinned photodiode for charge integration coupled to two BCMD transistors for charge storage and sensing. The BCMD transistors utilize a shared lateral reset structure. The pixel also has incorporated therein a JFET transistor functioning as a lateral anti-blooming device.

The drawing of FIG. 3 represents a simplified circuit diagram 300 of a CMOS sensor pixel that consists of a pinned photodiode 301 interfaced with two transfer gates 302 and 303 that transfer charge into two different BCMD transistors 304 and 305 respectively. The BCMD transistors 304 and 305 are reset by the reset transistors 306 and 307 when a reset pulse is applied to row reset gate bus 308. The BCMD transistors 304 and 305 are addressed by applying suitable biases to their gates through row address lines 309 and 310. A reset drain voltage is applied to this pixel through column bias line 311 and the output appears on column output line 312. From this simplified circuit schematic it is clear how the pixel operates. For low level signals, when during the long integration time enough charge accumulates in the pixel, it is no problem to transfer it into one BCMD transistor for storage and readout. However, when a high level signal is accumulated during the long integration time it would overflow the pixel well capacity and no useful information would be obtained. It is therefore advantageous to integrate charge again after a long integration time for a shorter period and transfer this charge into the second BCMD transistor. Since a shorter integration time is used the charge does not overflow the PD well capacity and a useful signal is thus stored in the second BCMD transistor. In order to prevent the pixel charge overflow and the overflow charge from flooding the BCMD transistor, the pixel has incorporated in it an anti-blooming device 313 that is essentially a JFET with its drain connected to the neighboring Vdd column bus line. The threshold voltage of this JFET determines the minimum potential in the pixel and thus the maximum level of charge that the pixel can store. After the pixel scanning is completed and signal read out the BCMD transistors are reset. Of course, it is also possible to have separate row reset lines for each transistor. This is not indicated in the schematic in FIG. 3. In the case where photodiodes are not saturated, it is still advantageous to collect both signals, one for the long integration time and one for the short integration time, since the signal composition process can be designed to lower noise.

Another application where the single pixel with two or more separate storage sites is useful is in image sensors that can detect intra-scene motion and serve as motion detectors. For this case the integration times are identical in length and the signal processing circuits located at the periphery of the array process only the difference in the signals from the two BCMD transistors. When nothing has moved in the scene the pixel signals are identical and no output is generated. However, when the scene target has moved a difference signal is generated and processed and displayed.

Figure 4:
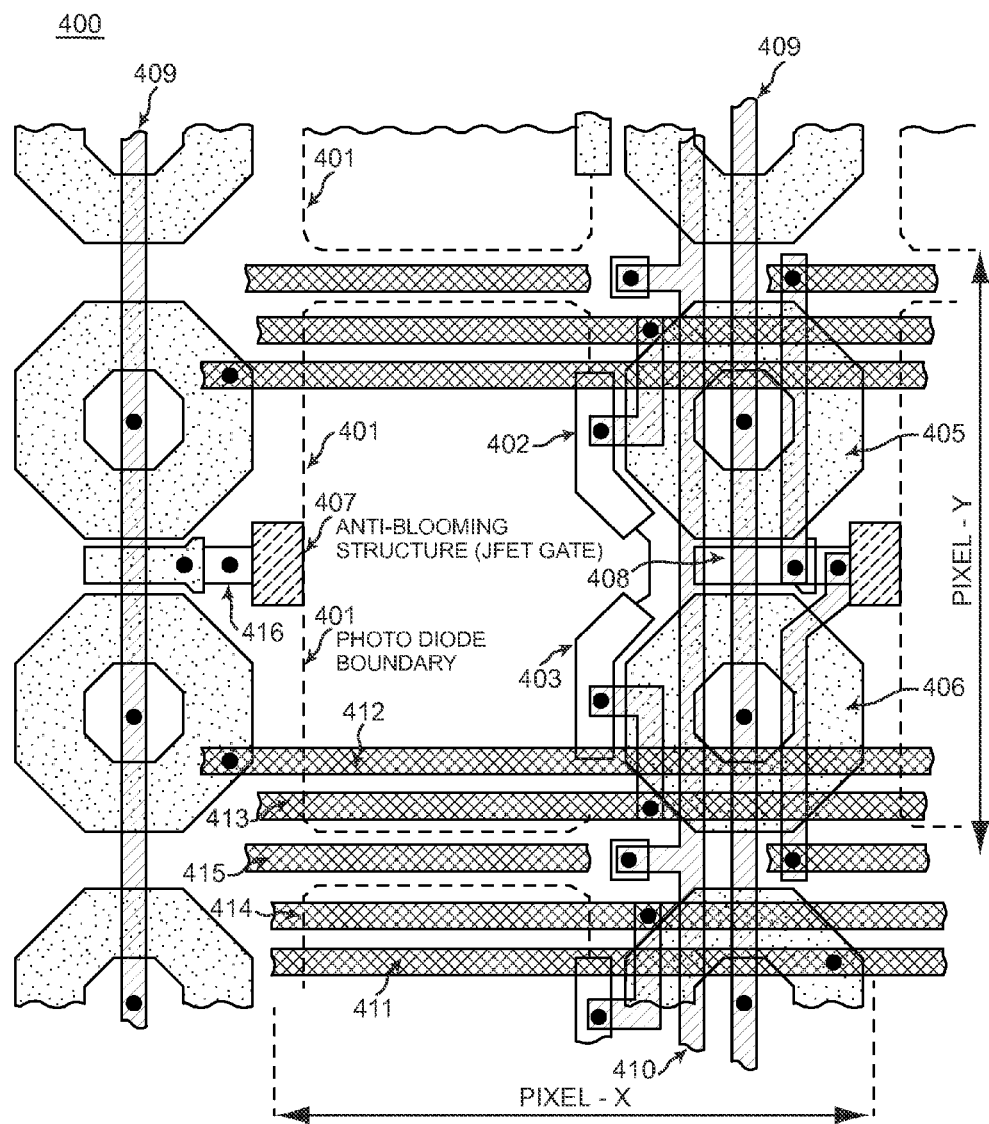
FIG. 4 is a simplified drawing of the top view topology of a CMOS sensor pixel layout showing the photodiode outline and two BCMD storing and sensing transistors coupled to a single photodiode by two transfer gates. The metal bus lines consist of only two metal layers. The contacts to the underlying metal and silicon layers are shown only schematically.

The drawing 400 in FIG. 4 is an example of one possible layout topology of the pixel with two BCMD transistors for a single photodiode. The photodiode 401 interfaces with two transfer gates 402 and 403 that transfer charge under two corresponding BCMD device gates 405 and 406. The photodiode also interfaces with the anti-blooming JFET gate 407.

The charge drain 416 serves as the drain for the overflow charge as well as for the reset charge when the reset is activated by pulsing the reset gate 408. The sources of the BCMD transistors are bussed together by the column bus line 409 where the output signal from the transistors is sensed by the peripheral circuits. The Vdd is supplied to the pixels through a row bus line 415. The pixel top ground contact is provided by another column bus line 410. The row bus lines 411, 412, 413, and 414 supply the pulse pixel select signals to the transfer gates and to the gates 405 and 406 of the BCMD transistors respectively. The column bus lines in the drawing 400 are formed from the first metal level while the row bus lines are formed by the second metal level. The metal to metal as well as the metal to substrate contacts are indicated in the drawing only schematically by large dots. There are many possible variations of this pixel layout. For example each BCMD transistor can have its own reset gate and reset drain. The JFET anti-blooming transistor can be replaced by an MOS transistor with a poly-silicon gate that can be pulsed to drain all the charge from the pixels when needed. All these modifications and variations are easily incorporated into this pixel embodiment and do not need to be described herein in more detail.

Figure 5:
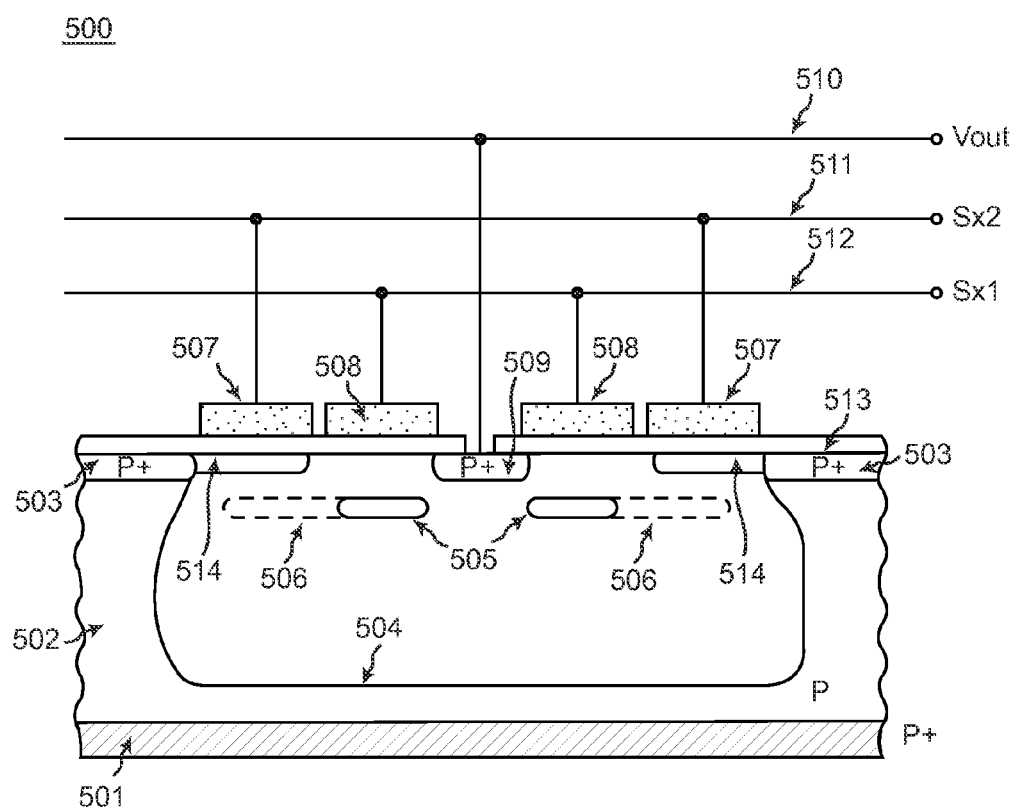
FIG. 5 shows a simplified cross section of a dual gate BCMD transistor that is used for charge storage and variable conversion gain charge sensing.

Another embodiment of the disclosed invention uses a pixel with a BCMD device that has multiple concentric gates. This allows changing the pixel conversion gain by applying different biases to these multiple gates. The simplified cross section of the multiple gate BCMD device is shown in the drawing 500 of FIG. 5. A p+ type doped substrate 501 has a p type epi-layer 502 deposited thereon. The epi-layer 502 and the entire array of pixels is covered by a gate oxide 513 except for the contact hole openings. The oxide layer isolates the circularly shaped gates 507 and 508 from the substrate. The source of the BCMD transistor is formed by a p+ type doped region 509. The biases to the gates are supplied by row bias lines 512 and 511 and the source, where the output signal is detected, is connected to column bus line 510. The pixels and the BCMD transistors are isolated from each other by the p+ type doped regions 503. FIG. 5 shows the BCMD transistor with only two concentric gates, but more than two are also possible. The dual gate BCMD functions as follows. When the gate 507 is biased by a negative bias voltage holes from the regions 503 are attracted under the gate and from a new drain for the transistor. The transistor effective gate area is thus smaller, which increases the conversion gain and reduces the well capacity. Electrons that affect the inner gate transistor threshold are stored only in the region 505. When both gates are biased together with the same biasing voltage the transistor effective gate area becomes larger, which results in larger well capacity and lower conversion gain. The electrons are now stored also in the area 506. It is thus possible to dynamically change the conversion gain of the pixel depending on the scene illumination resulting in higher sensor dynamic range and lower noise. For a better understanding of the variable conversion gain pixel function in a CMOS sensor array a circuit diagram of the pixel is shown in FIG. 6.

Figure 6:
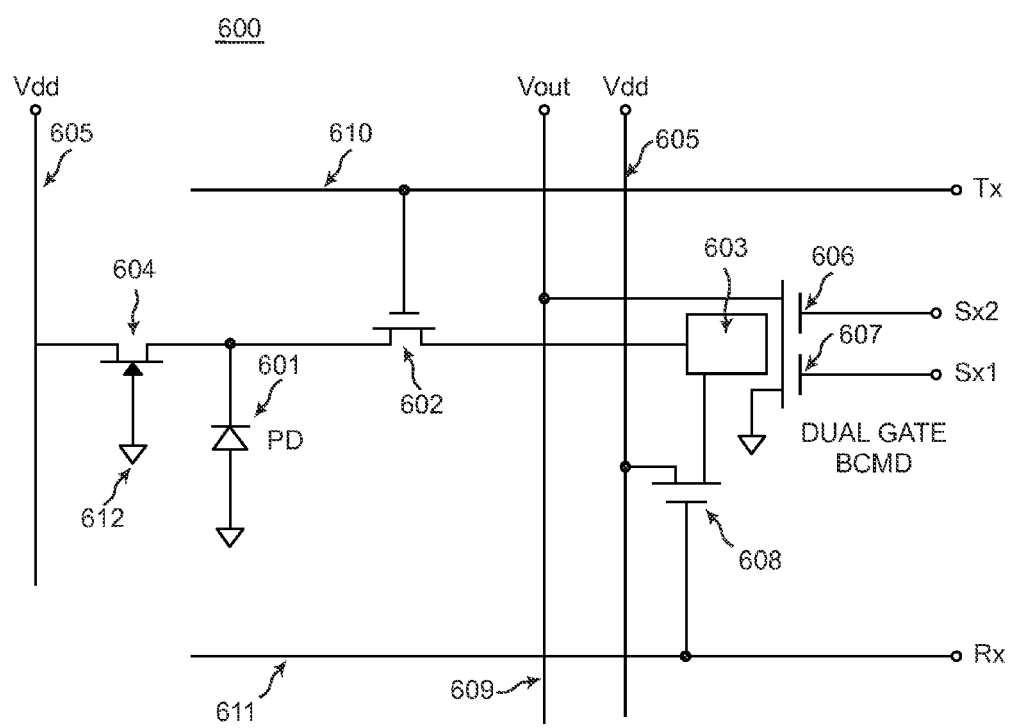
FIG. 6 shows a simplified equivalent circuit diagram of CMOS sensor pixels with a variable conversion gain dual gate BCMD transistor used for charge storing and sensing, charge transfer transistor, and a lateral charge reset transistor. Pixel addressing and conversion gain variation is accomplished by providing suitable biases to the BCMD transistor gates.

The drawing 600 in FIG. 6 represents a simplified equivalent circuit of the pixel of FIG. 5. The photodiode 601 collects the photo-generated signal charge that is transferred by pulsing the gate of the charge transfer transistor 602 into the BCMD transistor well 603. The accumulated charge in the photodiode is limited by the JFET anti-blooming device 604 that drains the excessive charge into the drain biased to Vdd potential by the column bias line 605. The BCMD potential well is reset by the transistor 608 and charge is drained also to the drain biased to the Vdd bias voltage by the column bias line 605. The well size and thus the conversion gain as well as the pixel row selection is controlled by applying the suitable biases to the BCMD transistor gates 606 and 607. The signal appears on column output line 609 where it can be sampled by the signal processing circuits located at the periphery of the array. The row bus lines 610 and 611 supply the charge transfer pulse and the reset pulse to the pixel. The pixel can also have a top ground contact bus 612 or the ground bias can be supplied to the pixels through the substrate. It is clear that there are three possible modes of operation of the dual gate BCMD transistor: first with the outside gate biased always low, which provides the highest conversion gain, followed by the second mode where both gates are biased simultaneously, which provides the lowest conversion gain and the third mode of operation where the inner gate is always biased low, which provides an intermediate conversion gain. However, this third mode of operation increases the capacitive loading on the column output line and may not be practical to use in standard and fast image sensing operation.

Figure 7:
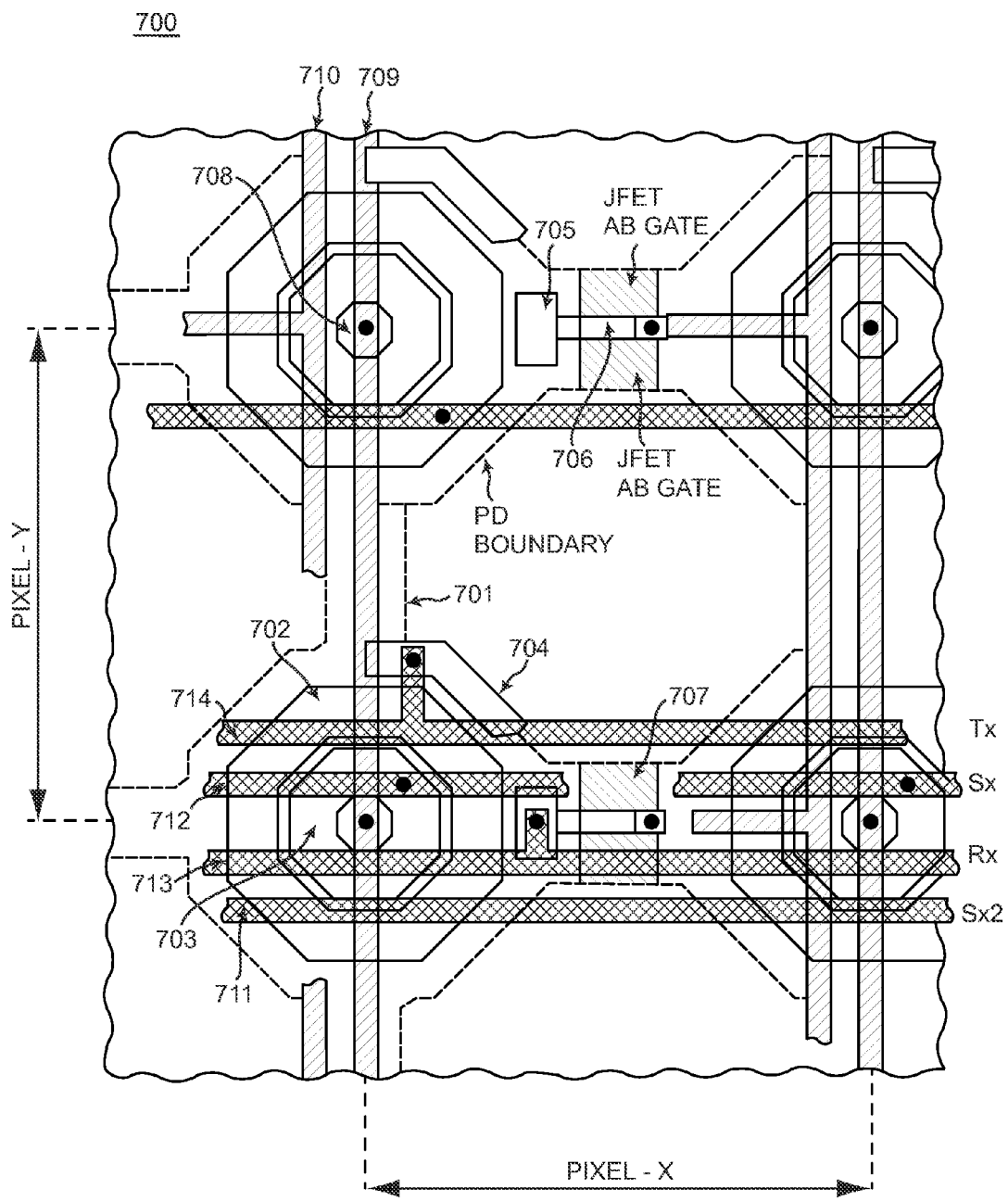
FIG. 7 is a simplified drawing of the top view topology of the CMOS sensor pixel layout showing the photodiode outline and a dual gate BCMD storing and sensing transistor with a lateral reset that consists of two concentric gates coupled to a single photodiode by a transfer gate. The transistor conversion gain is variable depending on the gate biasing conditions. The metal bus lines consist of only two metal layers. The contacts to the underlying metal or silicon layers are shown only schematically.

Finally, to complete the description of the pixel with the variable conversion gain using the dual gate BCMD transistor, a simplified top view of the pixel topology is shown in FIG. 7. The boundary line 701 surrounds the photodiode, which interfaces with the transfer gate 704 and with the JFET anti-blooming gate 707. The pixel drain 706 is common to both the anti-blooming structure as well as the reset transistor with the reset gate 705 interfacing with the outer ring gate 702 of the BCMD transistor. The inner ring is indicated in the drawing by the region 703. The central p+ type doped regions 708 of the BCMD transistors are bussed by the column output line 709 and the Vdd bias is supplied to the pixel by another column bus line 710. By various addressing, the conversion gain control signals, charge transfer signal and the reset signal are supplied to the pixels by the row bus lines 711, 712, 713, and 714. Other variations of this pixel layout are also possible. For example it would be possible to replace the JFET anti-blooming device with a standard MOS transistor having a poly-silicon gate that can be used to clear all charge from the pixels at any time, independently of the integration cycle.

There are many modifications possible to the disclosed invention and to the particular embodiments described in the above drawings. This is well known to all those skilled in the art. However, the key and main points of this invention that are novel are the multiple BCMD charge storage and sensing transistors coupled to a single photodiode and the multiple gate BCMD transistors that can provide the pixels with variable conversion gain. It would also be possible to combine these two inventive concepts to incorporate multiple BCMD charge storage and sensing transistors coupled to a single photodiode wherein the multiple BCMD transistors are concentric dual gate transistors, having variable conversion gain. It is also clear that the described pixels do not have to be operated only in a global shutter mode. Charge can be transferred into the pixels in a row sequential mode and read out. These modes of operation are all controlled by various timing pulses that are not the subject of this particular disclosure.

Having thus described the preferred embodiments of the novel pixel for the image sensor array with two BCMD charge storage and sensing transistors per single photodiode and a pixel with a dual gate BCMD transistor, thus providing a variable conversion gain, which embodiments are intended to be illustrative and not limiting, it is noted that persons skilled in the art can make modifications and variations in light of the above teachings. It is therefore to be understood that changes may be made in the particular embodiments of the invention disclosed, which are within the scope and spirit of the invention as defined by the appended claims.

What is claimed is:

1. A CMOS image sensor pixel array, wherein each pixel of the array includes at least one pixel circuit, comprising:
    at least two Bulk Charge Modulated Device (BCMD) transistors coupled to a single photodiode, wherein said BCMD transistors have the capability of storing charge transferred from the photodiode for all the pixels of the array simultaneously, thereby performing the global shuttering function;
    said stored charge being accumulated in said photodiodes during at least two different integration times;
    peripheral circuitry; and
    first and second transfer gates, wherein the first transfer gate is electrically connected between the photodiode and a first one of the BCMD transistors, wherein the second transfer gate is electrically connected between the photodiode and a second one of the BCMD transistors, and wherein each of the BCMD transistors has a gate electrically connected to a row address line.

2. The CMOS image sensor array of claim 1 wherein said BCMD transistors include independently addressed input and reset gates.

3. The CMOS image sensor array of claim 1 wherein said at least two BCMD transistors further include concentric dual-gate BCMD transistors, wherein said gates are biased at suitable levels to change the BCMD transistor conversion gain, thereby providing sensors having an improved dynamic range.

4. The CMOS image sensor array of claim 1 wherein said BCMD transistors have the capability of storing charge transferred from said photodiode for all the pixels of the array in a row by row manner, thereby performing the rolling shuttering function.

5. The CMOS image sensor of claim 4 wherein said BCMD transistors include independently addressed input and reset gates.

6. The CMOS image sensor array of claim 4 wherein said at least two BCMD transistors further include concentric dual-gate BCMD transistors, wherein said gates are biased at suitable levels to change the BCMD transistor conversion gain, thereby providing sensors having an improved dynamic range.

7. The CMOS image sensor pixel array of claim 1 wherein said photodiode has incorporated therein a JFET anti-blooming structure to drain away any overflow charge.

8. The CMOS image sensor array of claim 1 wherein said photodiode has incorporated therein a MOSFET anti-blooming structure to drain away any overflow charge.

9. The CMOS image sensor array of claim 1 wherein said peripheral circuitry performs a signal differencing function on said charge accumulated in said photodiode during at least two different integration times, thus providing for detection of intra-scene motion.

\* \* \* \* \*